(12) United States Patent
Takenouchi

(10) Patent No.: US 10,546,782 B2
(45) Date of Patent: Jan. 28, 2020

(54) METHOD OF PROCESSING WORKPIECE USING CUTTING FLUID

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/942,682

(22) Filed: Apr. 2, 2018

(65) Prior Publication Data

US 2018/0286758 A1 Oct. 4, 2018

(30) Foreign Application Priority Data

Apr. 4, 2017 (JP) .................. 2017-074250

(51) Int. Cl.
*H01L 21/78* (2006.01)
*H01L 21/3065* (2006.01)
(Continued)

(52) U.S. Cl.
CPC .......... *H01L 21/78* (2013.01); *H01L 21/3065* (2013.01); *H01L 21/30625* (2013.01); *H01L 21/308* (2013.01); *H01L 22/32* (2013.01)

(58) Field of Classification Search
CPC ......... H01L 21/78–786; H01L 21/3043; H01L 21/3065; H01L 21/308; H01L 22/32;
(Continued)

(56) References Cited

U.S. PATENT DOCUMENTS 5,461,008 A * 10/1995 Sutherland .............. B08B 17/00
                                                                438/460
6,280,298 B1    8/2001 Gonzales
                 (Continued)

FOREIGN PATENT DOCUMENTS

JP        06349926 A      12/1994
JP        09055573 A       2/1997
JP      2005021940 A       1/2005

OTHER PUBLICATIONS

Takenouchi, Kenji, U.S. Appl. No. 15/934,491, filed Mar. 23, 2018.
(Continued)

*Primary Examiner* — Laura M Menz
*Assistant Examiner* — Candice Chan
(74) *Attorney, Agent, or Firm* — Greer Burns & Crain Ltd.

(57) ABSTRACT

A method of processing a plate-shaped workpiece that includes layered bodies containing metal which are formed in superposed relation to projected dicing lines includes the steps of holding the workpiece on a first holding table such that the layered bodies are exposed, thereafter, cutting the workpiece along the projected dicing lines with a cutting blade to form cut grooves that sever the layered bodies, thereafter, holding the workpiece on a second holding table such that a mask disposed in areas that are exclusive of the projected dicing lines is exposed, and thereafter, performing dry etching on the workpiece through the mask to sever the workpiece along the projected dicing lines. The step of cutting the workpiece includes the step of cutting the workpiece while supplying a cutting fluid containing an organic acid and an oxidizing agent to the workpiece.

10 Claims, 5 Drawing Sheets

(51) Int. Cl.
*H01L 21/306* (2006.01)
*H01L 21/66* (2006.01)
*H01L 21/308* (2006.01)

(58) Field of Classification Search
CPC ............ H01L 22/34; H01L 21/30625; H01L 21/67092; H01L 21/32136; B28D 5/022; B23D 79/00
See application file for complete search history.

(56) References Cited

U.S. PATENT DOCUMENTS

| | | | |
|---|---|---|---|
| 6,310,017 B1 | 10/2001 | Grant et al. | |
| 6,461,940 B1 | 10/2002 | Hasegawa et al. | |
| 6,791,197 B1* | 9/2004 | Katz | B28D 5/022 257/48 |
| 9,130,057 B1 | 9/2015 | Kumar et al. | |
| 9,349,647 B2 | 5/2016 | Takenouchi | |
| 2003/0124771 A1 | 7/2003 | Maiz | |
| 2004/0209443 A1* | 10/2004 | Cadieux | B28D 5/0076 438/460 |
| 2004/0212047 A1 | 10/2004 | Joshi et al. | |
| 2006/0105546 A1 | 5/2006 | Genda et al. | |
| 2006/0223234 A1 | 10/2006 | Terayama et al. | |
| 2008/0191318 A1 | 8/2008 | Su et al. | |
| 2008/0277806 A1 | 11/2008 | Chen et al. | |
| 2011/0048200 A1 | 3/2011 | Ide et al. | |
| 2012/0286415 A1 | 11/2012 | Sakai et al. | |
| 2013/0203237 A1* | 8/2013 | Yamaguchi | H01L 21/78 438/460 |
| 2013/0234193 A1 | 9/2013 | Odnoblyudov et al. | |
| 2013/0267076 A1 | 10/2013 | Lei et al. | |
| 2014/0017882 A1* | 1/2014 | Lei | H01L 21/78 438/465 |
| 2014/0154871 A1 | 6/2014 | Hwang et al. | |
| 2015/0262881 A1* | 9/2015 | Takenouchi | H01L 21/78 438/460 |
| 2015/0279739 A1 | 10/2015 | Lei et al. | |
| 2017/0213757 A1 | 7/2017 | Nakamura et al. | |
| 2018/0166328 A1 | 6/2018 | Tang et al. | |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/937,402, filed Mar. 27, 2018.
Takenouchi, Kenji, U.S. Appl. No. 15/938,832, filed Mar. 28, 2018.
Takenouchi, Kenji, U.S. Appl. No. 15/938,755, filed Mar. 28, 2018.
Takenouchi, Kenji, U.S. Appl. No. 15/940,468, filed Mar. 29, 2018.
Takenouchi, Kenji, U.S. Appl. No. 15/940,411, filed Mar. 29, 2018.
Takenouchi, Kenji, U.S. Appl. No. 15/941,131, filed Mar. 30, 2018.

* cited by examiner

METHOD OF PROCESSING WORKPIECE USING CUTTING FLUID

BACKGROUND OF THE INVENTION

Field of the Invention

The present invention relates to a method of processing a plate-shaped workpiece that includes layered bodies containing metal which are formed in superposed relation to projected dicing lines.

Description of the Related Art

Electronic equipment, typically mobile phones and personal computers, incorporates, as indispensable components, device chips that have devices such as electronic circuits, etc. thereon. A device chip is manufactured by demarcating the face side of a wafer made of a semiconductor material such as silicon or the like into a plurality of areas with a plurality of projected dicing lines also known as streets, forming devices in the respective areas, and then dividing the wafer into device chips corresponding to the devices along the projected dicing lines.

In recent years, evaluation elements referred to as TEG (Test Element Group) for evaluating electric properties of devices are often formed on projected dicing lines on wafers as described above (see, for example, Japanese Patent Laid-open No. Hei 6-349926 and Japanese Patent Laid-open No. 2005-21940). The TEG on the projected dicing lines on a wafer makes it possible to maximize the number of device chips that can be fabricated from the wafer. Once the TEG has carried out evaluations and has been made redundant, it can be removed at the same time that the wafer is severed into device chips.

SUMMARY OF THE INVENTION

When layered bodies containing metal such as TEG are cut and removed by a cutting blade which is made of a binder with abrasive grains dispersed therein, the metal contained in the layered bodies is elongated, tending to give rise to protrusions called "burrs" due to contact with the cutting blade. If the cutting blade processes the wafer at an increased rate, then it generates more heat that is liable to produce larger burrs. Therefore, according to the processing method using the cutting blade, it is necessary to reduce the processing rate so as not to lower the quality of the processing of the wafer.

It is therefore an object of the present invention to provide a method of processing a plate-shaped workpiece that includes layered bodies containing metal which are formed in superposed relation to projected dicing lines, at an increased rate while keeping the quality of the processing of the workpiece.

In accordance with an aspect of the present invention, there is provided a method of processing a plate-shaped workpiece that includes layered bodies containing metal which are formed in superposed relation to projected dicing lines, including the steps of holding the workpiece on a first holding table such that the layered bodies are exposed, thereafter, cutting the workpiece along the projected dicing lines with a cutting blade to form cut grooves that sever the layered bodies, thereafter, holding the workpiece on a second holding table such that a mask disposed in areas that are exclusive of the projected dicing lines is exposed, and thereafter, performing dry etching on the workpiece through the mask to sever the workpiece along the projected dicing lines, in which the step of cutting the workpiece includes the step of cutting the workpiece while supplying a cutting fluid containing an organic acid and an oxidizing agent to the workpiece.

According to the method in accordance with the aspect of the present invention, the cutting fluid containing the organic acid and the oxidizing agent is supplied to the workpiece while the cut grooves that sever the layered bodies containing metal are formed in the workpiece. The organic acid and the oxidizing agent are effective to modify the metal contained in the layered bodies, thereby lowering the ductility of the metal while the cutting blade is severing the layered bodies. The metal is thus prevented from forming burrs even when the workpiece is processed at an increased rate. In other words, the rate at which the workpiece is processed can be increased while keeping the quality of the processing of the workpiece.

According to the method in accordance with the aspect of the present invention, furthermore, after the cut grooves that sever the layered bodies have been formed in the workpiece, dry etching is performed on the workpiece to sever the workpiece at once along all the projected dicing lines. Therefore, the time required to process the workpiece per projected dicing line is shortened while keeping the quality of the processing of the workpiece, especially if the number of the projected dicing lines on the workpiece is large. Consequently, the rate at which the workpiece is processed can be increased while keeping the quality of the processing of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of processing a workpiece according to an embodiment of the present invention will be described below with reference to the accompanying drawings. The method of processing a workpiece according to the present embodiment, also referred to as "workpiece processing method," is a method of processing a plate-shaped workpiece that includes layered bodies containing metal which are formed in superposed relation to projected dicing lines, and includes a first holding step (see FIG. 2B), a cutting step (see FIG. 3A), a mask forming step (see FIG. 3B), a second holding step (see FIG. 4A), and a dry etching step (see FIG. 4B).

In the first holding step, the workpiece is held on a chuck table (first holding table) of a cutting apparatus such that the layered bodies which are formed in superposed relation to the projected dicing lines are exposed. In the cutting step, the workpiece is cut along the projected dicing lines to form cut grooves in the workpiece, dividing the layered bodies, while a cutting fluid containing an organic acid and an oxidizing agent is being supplied to the workpiece. In the mask forming step, a mask is formed in areas of the workpiece that are exclusive of the projected dicing lines. In the second holding step, the workpiece is held on an electrostatic chuck (second holding table) of a dry etching apparatus such that the mask is exposed. In the dry etching step, a dry etching process is performed on the workpiece through the mask, cutting the workpiece along the projected dicing lines. The workpiece processing method according to the present embodiment will be described in detail below.

Figure 1A:
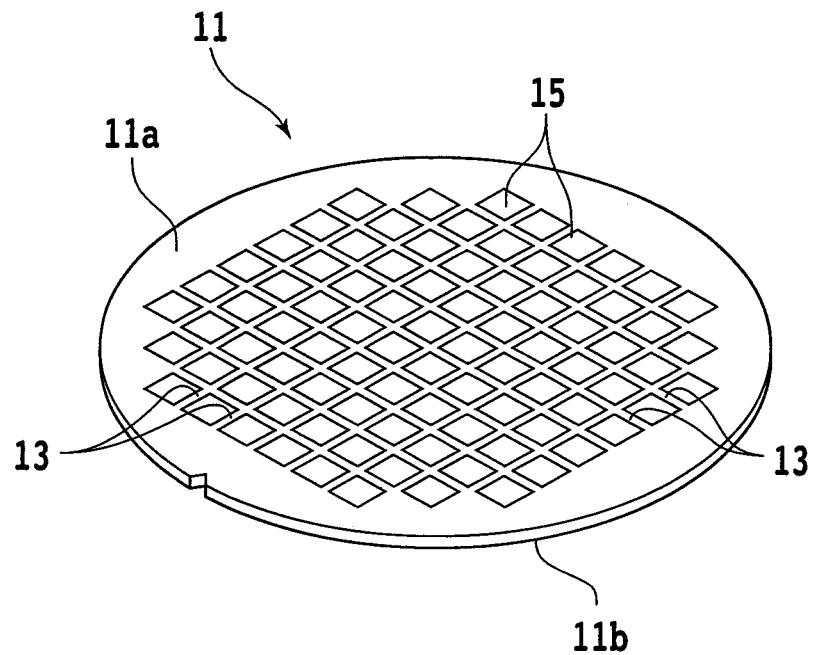
FIG. 1A is a perspective view schematically showing a workpiece by way of example.
Figure 1B:
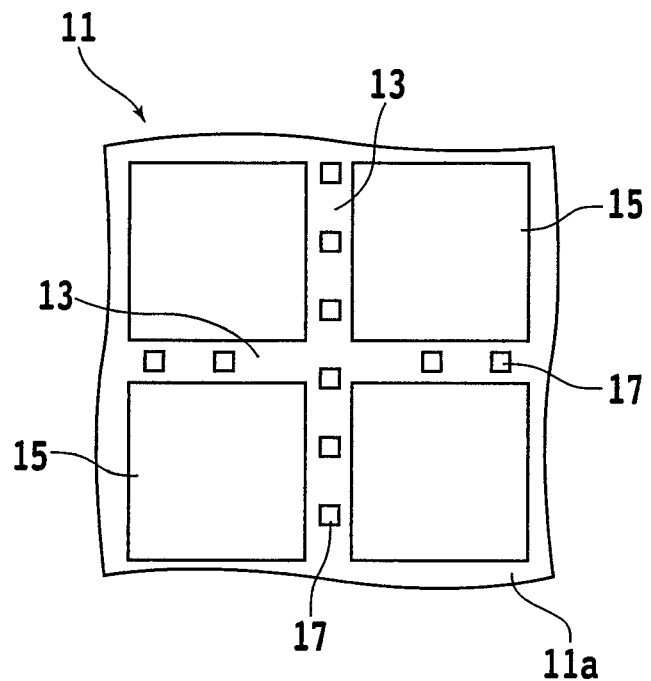
FIG. 1B is an enlarged fragmentary plan view of a face side of the workpiece.

FIG. 1A is a perspective view schematically showing a workpiece 11 by way of example, which is to be processed by the workpiece processing method according to the present embodiment, and FIG. 1B is an enlarged fragmentary plan view of a face side 11a of the workpiece 11. As shown in FIG. 1A, the workpiece 11 includes a disk-shaped wafer made of a semiconductor material such as silicon (Si) or the like, and the face side 11a thereof is divided into a central device area and an outer peripheral marginal area surrounding the central device area.

The central device area is further demarcated into a plurality of areas by a grid of projected dicing lines or streets 13, with devices 15 such as an ICs (Integrated Circuits) or the like being formed in the respective areas. As shown in FIG. 1B, a plurality of layered bodies 17 containing metal are disposed on the projected dicing lines 13. The layered bodies 17 are provided as evaluation elements referred to as TEG (Test Element Group), for example.

According to the present embodiment, the workpiece 11 is illustrated as including a disk-shaped wafer made of a semiconductor such as silicon or the like. However, the workpiece 11 is not limited to particular materials, shapes, structures, sizes, etc. Similarly, the devices 15 and the layered bodies 17 are not limited to particular kinds, quantities, shapes, structures, sizes, layouts, etc. For example, a packaged substrate where layered bodies 17 functioning as electrodes are formed along projected dicing lines 13 may be used as the workpiece 11.

Figure 2A:
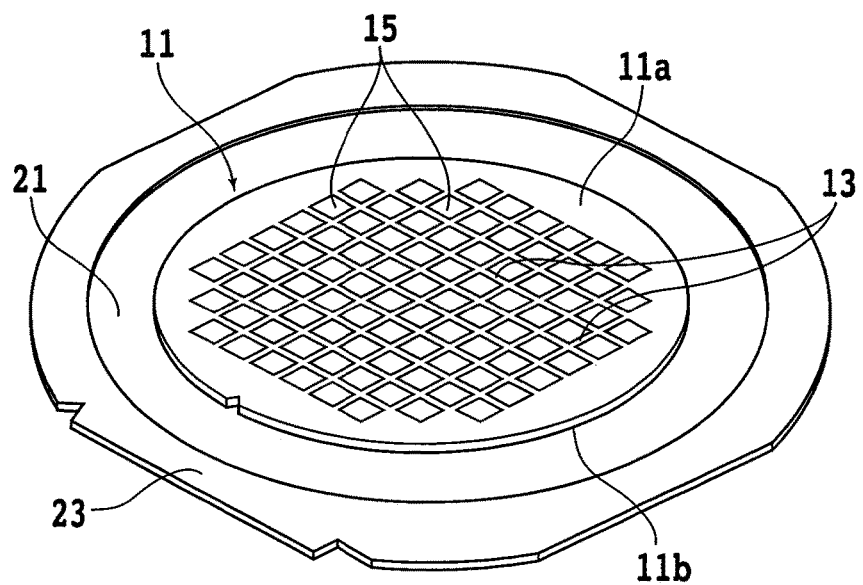
FIG. 2A is a perspective view schematically showing the workpiece to which a dicing tape, etc. is stuck.

FIG. 2A is a perspective view schematically showing the workpiece 11 to which a dicing tape 21, etc. is stuck. As shown in FIG. 2A, before the workpiece processing method according to the present embodiment is carried out, the dicing tape 21, which is larger in diameter than the workpiece 11, is stuck to a reverse side 11b of the workpiece 11. An annular frame 23 is fixed to an outer peripheral portion of the dicing tape 21.

The workpiece 11 is thus supported on the annular frame 23 by the dicing tape 21. Though an example in which the workpiece 11 supported on the annular frame 23 by the dicing tape 21 is processed will be described below in the present embodiment, the workpiece 11 may be processed without the dicing tape 21 and the frame 23 being used.

Figure 2B:
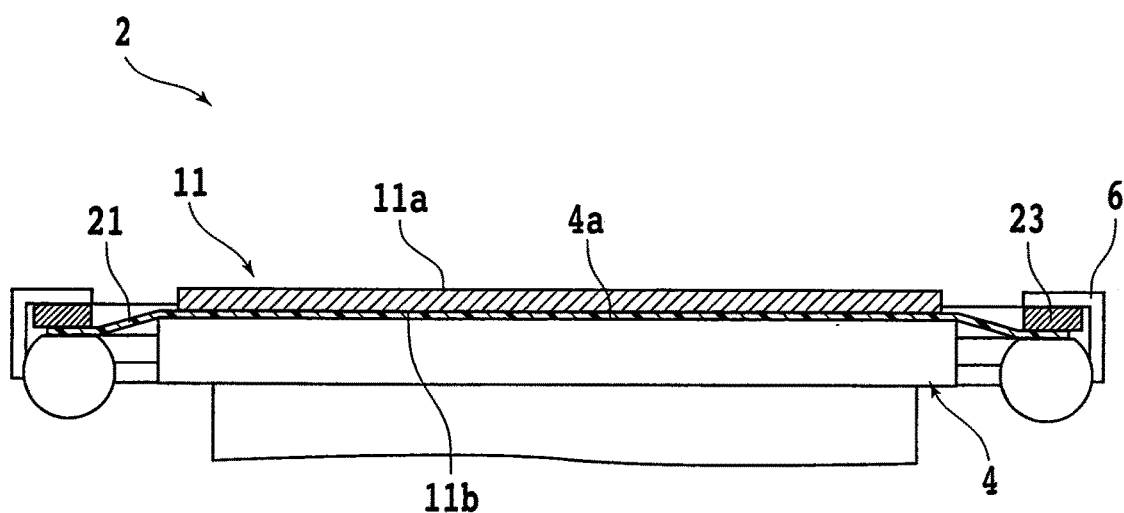
FIG. 2B is a side elevational view, partly in cross section, illustrative of a first holding step of a workpiece processing method according to an embodiment of the present invention.

In the workpiece processing method according to the present embodiment, the first holding step is carried out to hold the workpiece 11 on a chuck table (first holding table) of a cutting apparatus. FIG. 2B is a side elevational view, partly in cross section, illustrative of the first holding step. The first holding step is performed using a cutting apparatus 2 shown in FIG. 2B, for example. The cutting apparatus 2 includes a chuck table (first holding table) 4 for holding the workpiece 11 under suction thereon.

The chuck table 4 is coupled to a rotary actuator, not shown, such as a motor or the like, for rotation about an axis substantially parallel to a vertical direction. The chuck table 4 is disposed above a processing-feed mechanism, not shown, that moves the chuck table 4 in a processing-feed direction.

The chuck table 4 has an upper surface, part of which serves as a holding surface 4a for holding the workpiece 11, i.e., the dicing tape 21, under suction thereon. The holding surface 4a is connected to a suction source, not shown, through a suction channel, not shown, that is defined in the chuck table 4. When a negative pressure from the suction source is caused to act on the holding surface 4a, the workpiece 11 is held under suction on the chuck table 4. A plurality of clamps 6 for securing the annular frame 23 are provided on an outer peripheral region of the chuck table 4.

In the first holding step, the dicing tape 21 that sticks to the reverse side 11b of the workpiece 11 is held in contact with the holding surface 4a of the chuck table 4, and a negative pressure from the suction source is caused to act on the dicing tape 21. At the same time, the frame 23 is secured by the clamps 6. The workpiece 11 is thus securely held by the chuck table 4 and the clamps 6 with the layered bodies 17 on the face side 11a being exposed upwardly.

Figure 3A:
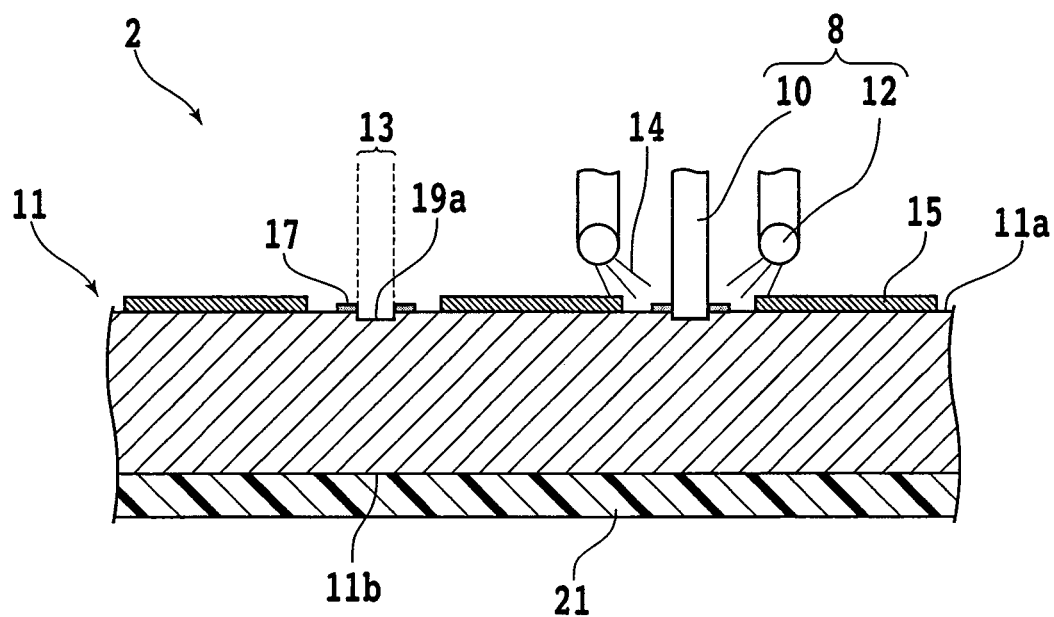
FIG. 3A is a fragmentary side elevational view, partly in cross section, illustrative of a cutting step of the workpiece processing method.

After the first holding step, the cutting step is carried out to form cut grooves in the workpiece 11 to sever the layered bodies 17. FIG. 3A is a fragmentary side elevational view, partly in cross section, illustrative of the cutting step. The cutting step is performed also using the cutting apparatus 2. As shown in FIG. 3A, the cutting apparatus 2 further includes a cutting unit 8 disposed above the chuck table 4.

The cutting unit 8 includes a spindle, not shown, that serves as a rotational shaft substantially perpendicular to the processing-feed direction. An annular cutting blade 10 made of a binder with abrasive grains dispersed therein is mounted on one end of the spindle. The other end of the spindle is coupled to a rotary actuator, not shown, such as a motor or the like. The cutting blade 10 on the one end of the spindle is rotatable about its own axis by forces transmitted from the rotary actuator.

The spindle is supported by a moving mechanism, not shown, which moves the cutting blade 10 in an indexing-feed direction perpendicular to the processing-feed direction and a vertical direction perpendicular to the processing-feed direction and the indexing-feed direction. A pair of nozzles 12 are disposed on both sides of the cutting blade 10, which is thus disposed between the nozzles 12. The nozzles 12 are arranged to supply a cutting fluid 14 to the cutting blade 10 and the workpiece 11.

In the cutting step, the chuck table 4 is rotated about its own axis to bring a target projected dicing line 13 into alignment with the processing-feed direction of the cutting apparatus 2. The chuck table 4 and the cutting unit 8 are moved relatively to each other to position the plane of the cutting blade 10 into alignment with an extension of the target projected dicing line 13. Then, the lower end of the cutting blade 10 is moved to a position lower than the lower surfaces of the layered bodies 17.

Thereafter, while the cutting blade 10 is rotated about its own axis, the chuck table 4 is moved in the processing-feed direction. At the same time, the nozzles 12 supply the cutting fluid 14 which contains an organic acid and an oxidizing agent to the cutting blade 10 and the workpiece 11. The cutting blade 10 cuts into the workpiece 11 along the target projected dicing line 13, forming in the face side 11a of the workpiece 11 a cut groove 19a that completely severs the layered bodies 17 on the target projected dicing line 13.

As the embodiment described above, the organic acid contained in the cutting fluid 14 modifies the metal in the layered bodies 17 to restrain its ductility. The oxidizing agent contained in the cutting fluid 14 makes it easier for the metal in the layered bodies 17 to be oxidized on its surface. As a result, the ductility of the metal in the layered bodies 17 is sufficiently lowered for increased processability of the workpiece 11.

As the organic acid included in the cutting fluid 14, there can be used, for example, a compound that has at least one carboxyl group and at least one amino group in its molecule. In this case, it is preferable that at least one of amino group(s) is a secondary or tertiary amino group. In addition, compound used as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin Cl, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N—N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent included in the cutting fluid 14, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 14. Mixing of the anticorrosive makes it possible to prevent corrosion (elution) of the metal included in the workpiece 11. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

The above process is repeated to cut to form cut grooves 19a along all projected dicing lines 13, whereupon the cutting step is finished. According to the present embodiment, as described above, the cutting fluid 14 which contains an organic acid and an oxidizing agent is supplied to the workpiece 11 in severing the layered bodies 17 that contain metal with the cutting blade 10. The organic acid and the oxidizing agent are effective to modify the metal contained in the layered bodies 17, thereby lowering the ductility of the metal while the cutting blade 10 is severing the layered bodies 17. The metal is thus prevented from forming burrs even when the workpiece 11 is processed at an increased rate.

Figure 3B:
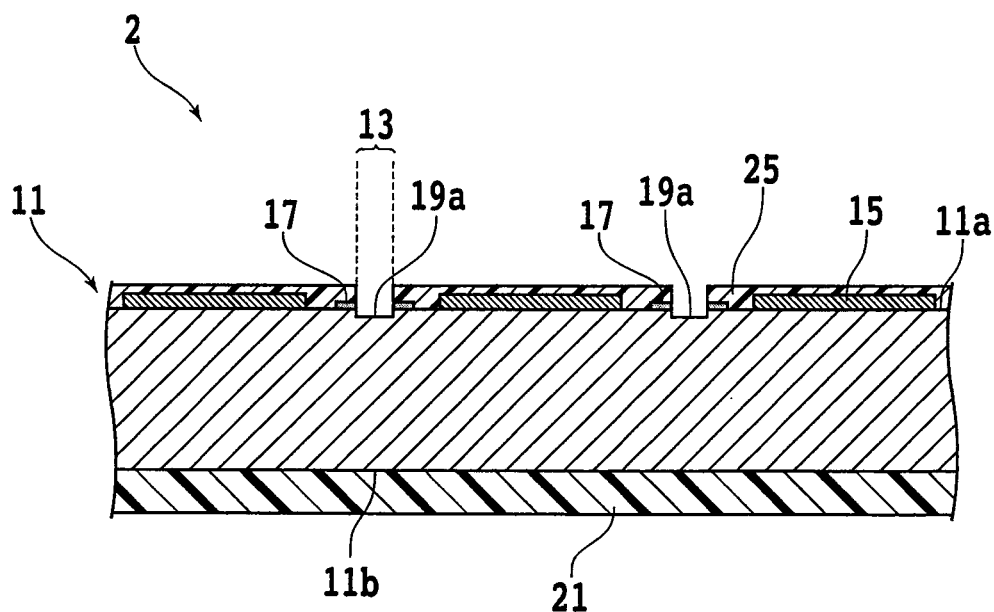
FIG. 3B is a fragmentary side elevational view, partly in cross section, illustrative of a mask forming step of the workpiece processing method.

The cutting step is followed by the mask forming step to form a mask for dry etching in covering relation to the face side 11a of the workpiece 11. FIG. 3B is a fragmentary side elevational view, partly in cross section, illustrative of the mask forming step, and schematically shows a mask 25 formed on the face side 11a of the workpiece 11.

The mask 25 is formed by a process such as photolithography or the like, and has at least a certain degree of resistance against subsequent dry etching. As shown in FIG. 3B, the mask 25 is formed in order to expose the projected dicing lines 13, i.e., the cut grooves 19a. In other words, the mask 25 is provided in areas exclusive of the projected dicing lines 13, i.e., the cut grooves 19a.

Figure 4A:
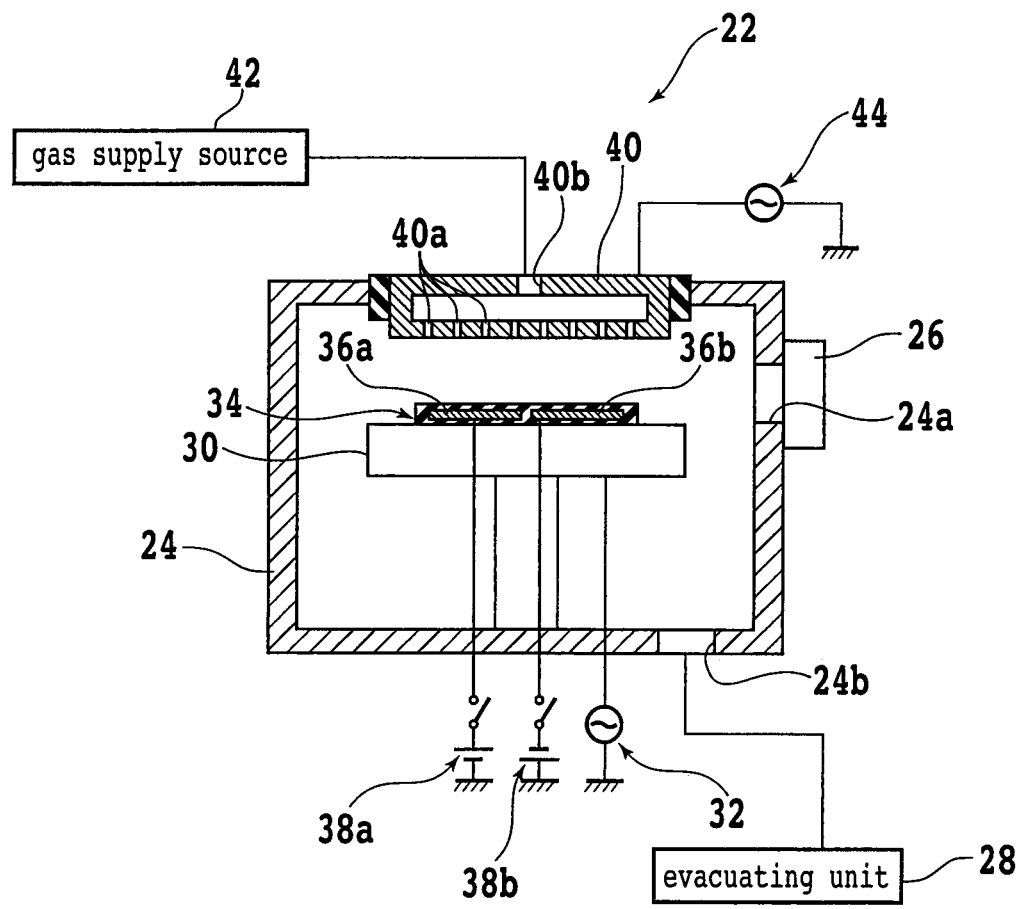
FIG. 4A is a view schematically showing a dry etching apparatus.

The mask forming step is followed by the second holding step to hold the workpiece 11 on an electrostatic chuck (second holding table) of a dry etching apparatus (plasma etching apparatus). FIG. 4A is a sectional elevational view schematically showing a dry etching apparatus (plasma etching apparatus) 22. The dry etching apparatus 22 includes a vacuum chamber 24 having a processing space defined therein. The vacuum chamber 24 includes a side wall having an opening 24a defined therein through which the workpiece 11 can be loaded into and out of the processing space in the vacuum chamber 24.

A gate 26 is provided outside of the opening 24a for selectively opening and closing the opening 24a. The gate 26 is connected to an opening/closing mechanism, not shown, which selectively opens and closes the gate 26. When the gate 26 is opened to expose the opening 24a, the workpiece 11 can be loaded through the opening 24a into the processing space in the vacuum chamber 24 or out of the processing space in the vacuum chamber 24.

The vacuum chamber 24 includes a bottom wall having an evacuating port 24b defined therein that is connected to an evacuating unit 28 such as a vacuum pump or the like. A lower electrode 30 is disposed in the processing space in the vacuum chamber 24. The lower electrode 30 is of a disk shape and made of an electrically conductive material, and is electrically connected to a high-frequency power supply 32 disposed outside of the vacuum chamber 24.

An electrostatic chuck 34 is disposed on an upper surface of the lower electrode 30. The electrostatic chuck 34 has a plurality of electrodes 36a and 36b that are insulated from each other, for example. The electrostatic chuck 34 attracts and holds the workpiece 11 under electric forces generated between the electrodes 36a and 36b, and the workpiece 11. The electrostatic chuck 34 according to the present embodiment is arranged such that the electrode 36a can be connected to the positive terminal of a direct current (DC) power supply 38a whereas the electrode 36b can be connected to the negative terminal of a DC power supply 38b.

An upper electrode 40 that is of a disk shape and made of an electrically conductive material is mounted on a ceiling wall of the vacuum chamber 24 with an insulator interposed therebetween. The upper electrode 40 has a plurality of gas ejection holes 40a defined in a lower surface thereof that are connected to a gas supply source 42 through a gas supply hole 40b defined in an upper surface of the upper electrode 40. Therefore, the gas supply source 42 can supply a material gas for dry etching through the gas supply hole 40b and the gas ejection holes 40a to the processing space in the vacuum chamber 24. The upper electrode 40 is electrically connected to a high-frequency power supply 44 disposed outside of the vacuum chamber 24.

In the second holding step, the opening/closing mechanism lowers the gate 26, exposing the opening 24a. Then, the workpiece 11 is loaded through the exposed opening 24a into the processing space in the vacuum chamber 24, and placed on the electronic chuck 34. Specifically, the dicing tape 21 that sticks to the reverse side 11b of the workpiece 11 is held in contact with the upper surface of the electrostatic chuck 34. Thereafter, the electrostatic chuck 34 is energized to attract and hold the workpiece 11 thereon while the mask 25 on the face side 11a thereof is exposed upwardly.

After the second holding step, the dry etching step is carried out to perform dry etching (plasma etching) on the workpiece 11 through the mask 25 to cut the workpiece 11 along the projected dicing lines 13. The dry etching step is performed also using the dry etching apparatus 22.

Specifically, the opening/closing mechanism lifts the gate 26, closing the processing space in the vacuum chamber 24. Then, the evacuating unit 28 is actuated to depressurize the processing space. While the material gas for dry etching is being supplied from the gas supply source 42 at a predetermined flow rate, the high-frequency power supplies 32 and 44 supply appropriate high-frequency electric power to the lower electrode 30 and the upper electrode 40, respectively, producing a plasma containing radicals, ions, etc. between the lower electrode 30 and the upper electrode 40.

The portions of the face side 11a of the workpiece 11 that are not covered with the mask 25, i.e., the projected dicing lines 13 or the cut grooves 19b, are exposed to the plasma, which processes the workpiece 11. The material gas for dry etching that is supplied from the gas supply source 42 may be a suitable gas selected depending on the material, etc. of the workpiece 11. The dry etching step is continued until the workpiece 11 is fully severed along the projected dicing lines 13.

Figure 4B:
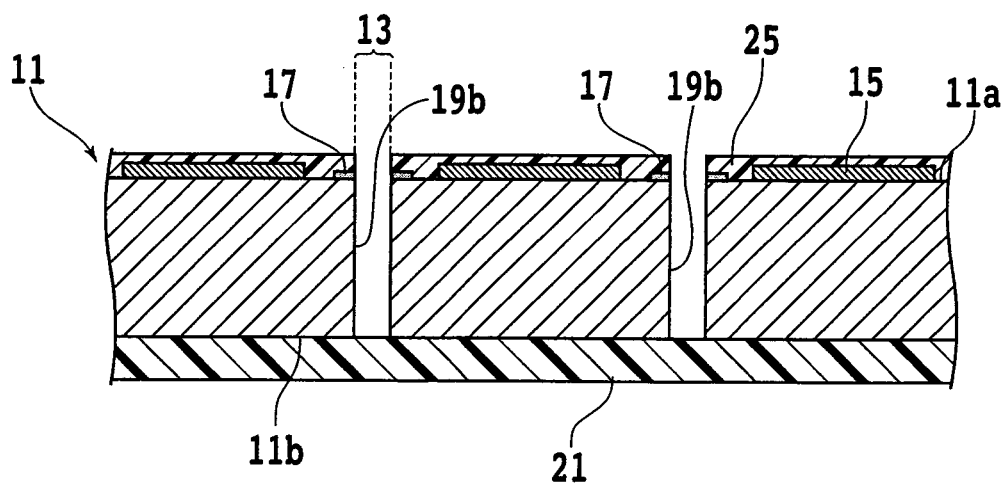
FIG. 4B is a fragmentary side elevational view, partly in cross section, schematically showing the workpiece that has been cut in a dry etching step of the workpiece processing method.

FIG. 4B is a fragmentary side elevational view, partly in cross section, schematically showing the workpiece 11 that has been cut in the dry etching step. According to the present embodiment, since the layered bodies 17 formed on the face side 11a in superposed relation to the projected dicing lines 13 have been cut off, the workpiece 11 is fully severed and divided into a plurality of device chips in the dry etching step, as shown in FIG. 4B.

In the dry etching step, inasmuch as the workpiece 11 is severed at once along all the projected dicing lines 13, the time required to process the workpiece 11 per projected dicing line 13 is shortened while keeping the quality of the processing of the workpiece 11, especially if the number of the projected dicing lines 13 on the workpiece 11 is large. Faces that are newly generated in the workpiece 11 in the dry etching step serve as side faces 19b of the device chips. After the dry etching step, the mask 25 is removed by ashing or the like.

In the workpiece processing method according to the present embodiment, as described above, the cutting fluid 14 which contains an organic acid and an oxidizing agent is supplied to the cutting blade 10 and the workpiece 11 in forming the cut grooves 19a that sever the layered bodies 17 containing metal. The organic acid and the oxidizing agent are effective to modify the metal contained in the layered bodies 17, thereby lowering the ductility of the metal while the cutting blade 10 is severing the layered bodies 17. The metal is thus prevented from forming burrs even when the workpiece 11 is processed at an increased rate. In other words, the rate at which the workpiece 11 is processed can be increased while keeping the quality of the processing of the workpiece 11.

The present invention is not limited to the above embodiment, but various changes and modifications may be made therein. For example, while the workpiece 11 in which the layered bodies 17 containing metal are formed on the face side 11a thereof is processed in the above embodiment, a workpiece in which layered bodies containing metal are formed on the reverse side thereof may be processed.

According to such a modification, the workpiece is cut from the reverse side thereof. The workpiece may include a wafer or the like in which layered bodies, e.g., multi-layer metal films of titanium (Ti), nickel (Ni), gold (Au), etc., functioning as electrodes and having a thickness of approximately several μm are provided on the reverse side thereof.

In the above embodiment, the dry etching step is performed on the workpiece 11 from the face side 11a thereof. However, the dry etching step may be performed on the workpiece 11 from the reverse side 11b thereof. According to such a modification, a mask may be provided on those portions of the reverse side 11b of the workpiece 11 which are exclusive of, i.e., out of alignment with, the projected dicing lines 13.

In the above embodiment, the mask forming step is performed after the cutting step. However, the cutting step may be performed after the mask forming step. According to such a modification, since the mask as well as the layered bodies can be processed using the cutting blade, it is not necessary to use a process such as photolithography or the like for forming a mask pattern.

Figure 5:
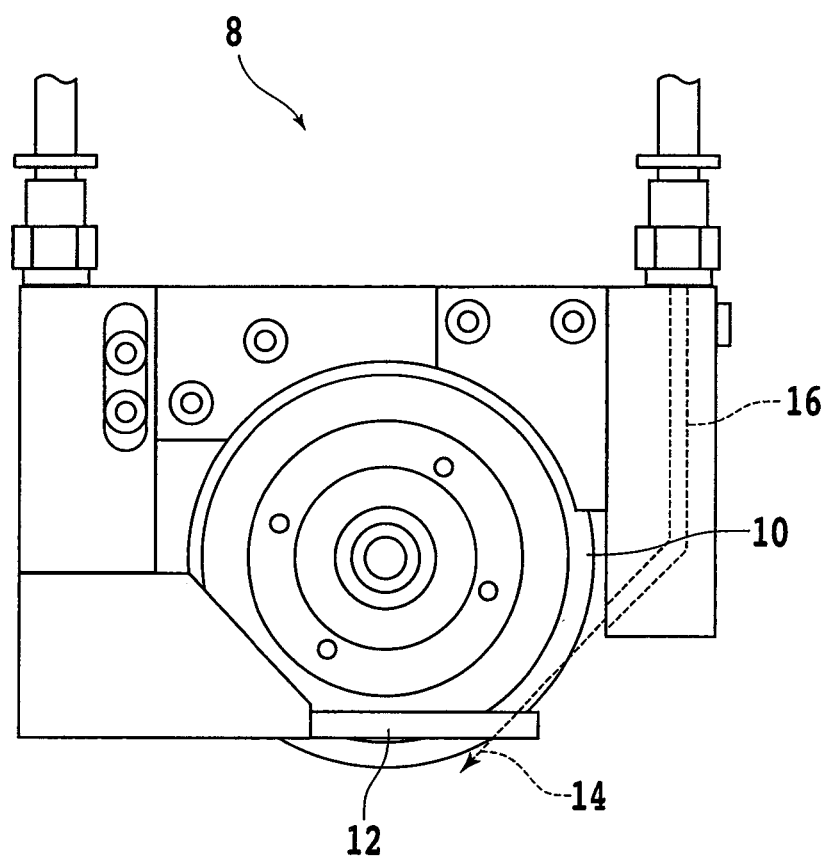
FIG. 5 is a side elevational view of a nozzle for supplying a cutting fluid according to another mode of the present invention.

In the above cutting step, the cutting fluid 14 is supplied from the nozzles 12 disposed on both sides of the cutting blade 10. However, the present invention is not limited to any particular nozzle configuration for supplying the cutting fluid 14. FIG. 5 is a side elevational view of a nozzle for supplying the cutting fluid 14 according to another mode of the present invention. As shown in FIG. 5, a cutting unit 8 as a modification, includes, in addition to the cutting blade 10 and the pair of nozzles 12, a shower nozzle 16 disposed in front of or behind the cutting blade 10.

The nozzle 16 makes it easier to supply the cutting fluid 14 to the cut groove 19a for more effectively modifying the metal contained in the layered bodies 17. In particular, the nozzle 16 has an ejection port oriented obliquely downwardly toward a region where the cutting blade 10 processes the workpiece 11, as shown in FIG. 5, so that the cut groove 19a is supplied and filled with an increased amount of cutting fluid 14 for more effectively modifying the metal contained in the layered bodies 17. Though both the nozzles 12 and the nozzle 16 are used in FIG. 5, the nozzles 12 may be dispensed with and only the nozzle 16 may be used alone.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a plate-shaped workpiece that includes layered bodies containing metal which are formed in superposed relation to projected dicing lines, comprising the steps of:

holding said workpiece on a first holding table such that said layered bodies are exposed;

thereafter, cutting said workpiece along said projected dicing lines with a cutting blade to form cut grooves that sever said layered bodies, said cut grooves extending through said layered body at a constant width;

thereafter, holding said workpiece on a second holding table such that a mask disposed in areas that are exclusive of said projected dicing lines is exposed; and thereafter, performing dry etching on said workpiece through said mask to sever said workpiece along said projected dicing lines;

wherein the step of cutting said workpiece includes the step of cutting said workpiece while supplying a cutting fluid containing an organic acid for reducing ductility in the metal in the layered bodies, an oxidizing agent for oxidizing the metal in the layered bodies, and an anticorrosive for preventing corrosion of metal in said workpiece, to said workpiece, and wherein said organic acid and said oxidizing agent in said cutting fluid cooperatively function to reduce burrs from forming from said layered bodies.

2. The method of processing a plate-shaped workpiece as defined in claim 1, wherein the cutting fluid is supplied to said workpiece by a pair of nozzles provided one on each side of said cutting blade.

3. The method of processing a plate-shaped workpiece as defined in claim 2, wherein the cutting fluid is supplied to said workpiece further by a third nozzle disposed in front of said cutting blade or in back of said cutting blade.

4. The method of processing a plate-shaped workpiece as defined in claim 1, wherein the cutting fluid is supplied to said workpiece by a nozzle disposed in front of said cutting blade or in back of said cutting blade.

5. The method of processing a plate-shaped workpiece as defined in claim 1, wherein said cutting blade is made of a binder with abrasive grains dispersed therein.

6. The method of processing a plate-shaped workpiece as defined in claim 1, wherein said second holding table is an electrostatic chuck that attracts and holds said workpiece between a pair of electrostatic electrodes.

7. The method of processing a plate-shaped workpiece as defined in claim 6, wherein said electrostatic chuck is provided on a lower electrode connected to a first high-frequency power supply and facing an upper electrode connected to a second high-frequency power supply; and wherein power is supplied from said first high-frequency power supply to said lower electrode and from said second high-frequency power supply to said upper electrode to generate plasma for performing dry etching on said workpiece.

8. The method of processing a plate-shaped workpiece as defined in claim 7, wherein said second holding table is provided in a vacuum chamber and said plasma is generated from gas supplied into said vacuum chamber through a plurality of gas ejection holes formed in a lower surface of said upper electrode.

9. The method of processing a plate-shaped workpiece as defined in claim 8, wherein said upper electrode includes a gas supply hole provided on an upper surface for receiving the gas from a gas supply source.

10. The method of processing a plate-shaped workpiece as defined in claim 8, wherein said upper electrode is configured to form a part of said vacuum chamber.

* * * * *